United States Patent [19]

Zurakowski

[11] Patent Number: 4,839,709

[45] Date of Patent: Jun. 13, 1989

[54] DETECTOR AND MIXER DIODE OPERATIVE AT ZERO BIAS VOLTAGE

[75] Inventor: Mark P. Zurakowski, Santa Rosa, Calif.

[73] Assignee: Hewlett-Packard Company, Palo Alto, Calif.

[21] Appl. No.: 87,953

[22] Filed: Aug. 10, 1987

Related U.S. Application Data

[63] Continuation of Ser. No. 754,693, Jul. 12, 1985, abandoned.

[51] Int. Cl.⁴ .............................................. H01L 27/14
[52] U.S. Cl. ....................................... 357/30; 357/58; 357/4; 357/13
[58] Field of Search ............... 357/58, 13, 30 L, 30 F, 357/30 P, 30 D, 30 B, 30 I, 4

[56] References Cited

U.S. PATENT DOCUMENTS

| | | | |
|---|---|---|---|
| 3,821,777 | 6/1974 | James | 357/30 |
| 3,940,783 | 2/1976 | Polata | 357/13 |
| 4,083,062 | 4/1978 | Ohuchi et al. | 357/30 X |
| 4,129,878 | 12/1978 | Webb | 357/13 |
| 4,379,943 | 4/1983 | Yang et al. | 357/58 X |
| 4,410,902 | 10/1983 | Malik | 357/58 X |
| 4,471,370 | 9/1984 | Chen et al. | 357/30 |
| 4,682,196 | 7/1987 | Sakai et al. | 357/58 X |

FOREIGN PATENT DOCUMENTS

3436927 4/1986 Fed. Rep. of Germany .... 357/30 P

OTHER PUBLICATIONS

Palmateer et al., "The Use of Substrate Annealing as a Gettering Technique Prior to Molecular Beam Epitaxial Growth", *J. Vac. Sci. Technol.* B2(2), Apr.-Jun. 1984, pp. 188-193.

Palmateer et al., "A Study of Substrate Effects on Planar Doped Structures in Gallium Aresenide Grown by Molecular Beam Epitaxy", *Inst. Phys. Conf. Ser. No. 65*, Chap. 3, (1983), Paper Presented at Int. Symp. GaAs and Related Compounds, Albuquerque, N.M., 1982.

*Primary Examiner*—Andrew J. James
*Assistant Examiner*—William A. Mintel
*Attorney, Agent, or Firm*—William J. Bethurum; William C. Milks, III

[57] ABSTRACT

This invention is directed to an NPIN (or PNIP) diode structure and epitaxial process for fabricating same wherein the thickness and doping levels of the intermediate layers of the structure and such that these layers are substantially depleted of majority carriers and therefore enable the structure to be operated at zero volts DC bias. This structure may be utilized either as an efficient detector diode or a mixer diode substantially free of odd order harmonic mixing products, and both devices may be fabricated in a single molecular beam epitaxial process with the advantage of high control over epitaxial layer thickness and impurity concentration.

11 Claims, 4 Drawing Sheets

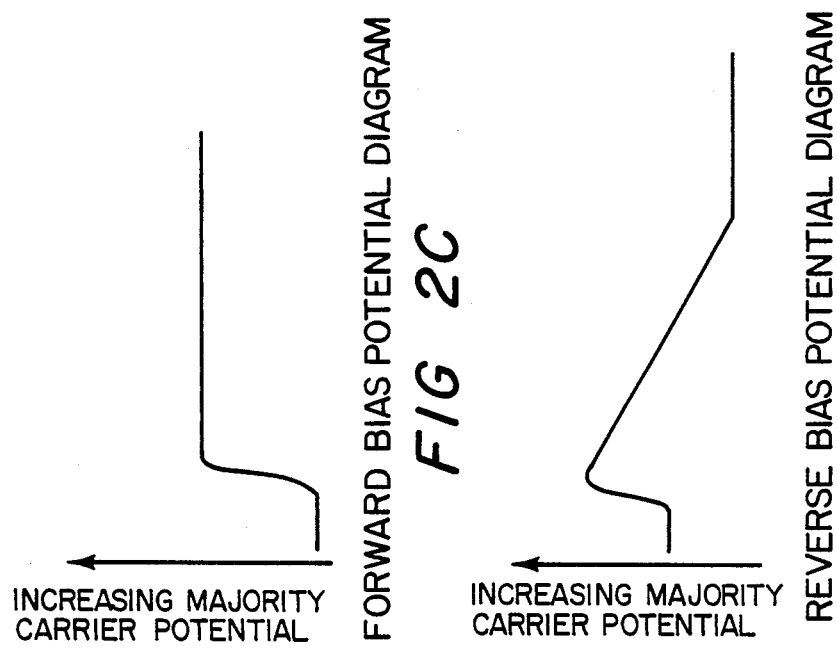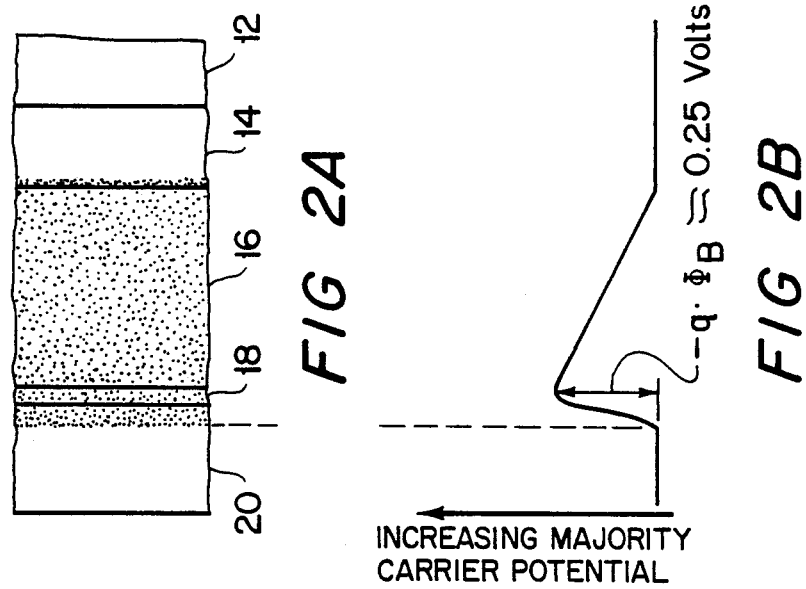

ANTI-PARALLEL MIXER DIODE PAIR

SYMMETRICAL I-V CHARACTERISTIC TO ELIMINATE ODD ORDER HARMONICS

CURRENT
VOLTAGE

CURRENT (I)
VOLTAGE (V)

$\frac{dI}{dV} = R_v = 1000\,\Omega$ VIDEO RESISTANCE AT ZERO BIAS

DETECTOR AND MIXER DIODE OPERATIVE AT ZERO BIAS VOLTAGE

This application is a continuation of application Ser. No. 754,693, filed 7/12/85, now abandoned.

FIELD OF THE INVENTION

This invention relates generally to semiconductor diode detectors useful for microwave and millimeter wave applications, and more particularly to such detectors which are operative at high detection efficiencies with zero bias voltage. Additionally, the multi-functional structure of the diode detector disclosed and claimed herein is uniquely adapted to operate in the antiparallel mixing mode with an identical reversely poled structure to form a highly symmetrical mixer diode pair, also operable with zero volts bias and substantially free of odd order harmonic mixing products.

BACKGROUND

In the field of microwave and millimeter detection, it is a common practice to provide a predetermined bias voltage on a semiconductor diode in order to set the DC operating point on a nonlinear region of the diode's current-voltage (I-V) characteristic in order to provide for maximum detection efficiency. Typically, this DC bias voltage is on the order of 0.7 volts where the diode is highly conductive in a range on one side of the DC bias voltage point and rather lighty conductive in a range on the other side of this DC bias voltage.

There are, however, several significant disadvantages in the requirement for a DC bias voltage on the diode detector. First, the requirement per se of DC bias circuitry between a power supply and the detector diode adds cost and complexity to the detector arrangement. Secondly, there is a certain amount of noise associated with the DC bias voltage, and this noise degrades the sensitivity and decreases the dynamic range of the detection. Thirdly, the bias voltage is thermally sensitive and will therefore frequently cause the DC bias operating point on the diode's I-V characteristic to be shifted in response to changes in ambient temperature at the DC bias source.

Similarly, when employing mixer diodes, it has been a common practice to provide a DC bias voltage across the mixer diode or diodes in order to establish a desired operating point on the I-V characteristic of these diodes. One such mixer diode structure is disclosed for example by Malik in U.S. Pat. No. 4,410,902. However, an additional problem in the Malik mixer structure arises from the fact that there will be some extraneous and undesirable doping in the body of the Malik structure from impuritis in the substrate moving upwardly into the epitaxial layers thereon. This doping results in an unevenly distributed and extraneous impurity profile across these layers, and this profile in turn produces dissimilar and asymmetrical I-V curves in the first and third quadrants of the device's composite I-V characteristic. Such asymmetrical I-V characteristics ultimately result in the generation of unwanted odd harmonic signals of the fundamental mixing frequency.

For a further discussion of this problem of extraneous doping in mixer structures of the type disclosed by Malik in U.S. Pat. No. 4,410,902, reference may be made to an article by S. C. Palmateer, et al., entitled "A study of substrate effects on planar doped structures in gallium arsenide grown by molecular beam epitaxy", Institute Physics Conference, Ser. No. 65: Chapter 3, presented at the International Symposium of Gallium Arsenide and Related Compounds, Albuquerque, 1982, at page 149 et seq.

In the field of diode detection there has been at least one attempt to provide a detector diode which operates with zero bias. Such an attempt is evidenced for example in U.S. Pat. No. 3,968,272 issued to Anand. However, the Anand device relies upon the reaction of a semiconductor surface with certain metals in a controlled manner. It is well known that such semiconductor surface chemistry is difficult to control and this fact will in turn affect device yields and repeatability of results. Additionally, using the Anand process stable barrier heights have only been demonstrated in silicon which has a lower electron velocity than gallium arsenide, and thus operates at slower speeds than GaAs, a fact which further contributes to the slower speeds of silicon devices.

THE INVENTION

The general purpose of the present invention is to provide a new and improved detector diode which is operative at zero volts bias with a high detection efficiency and which therefore overcomes the aforedescribed disadvantages of the prior art. An additional purpose of this invention is to simultaneously provide a diode structure which is uniquely suited and adapted to operate with an identical, reversely poled diode structure in an antiparallel mixing mode, having a highly symmetrical I-V characteristic and substantially free of odd order harmonic generation. Thus, this multi-functional diode structure may advantageously be constructed in a single wafer fabrication process which, in a preferred embodiment, employs molecular beam epitaxial growth to achieve high quality, high purity, and high thickness control in the multiple epitaxial layers. The resultant diode structure may be operated either as an efficient detector diode, or it may be connected in the anti-parallel mode with an identical mixer diode to exhibit a highly symmetrical composite I-V characteristic necessary for the prevention of odd harmonic frequency generation.

To accomplish the above purposes, I have discovered and developed a new and improved diode structure which includes an intrinsic or substantially intrinsic (or lightly doped) layer of semiconductor material of predetermined thickness upon which a thin critical layer of one conductivity-type semiconductor material is epitaxially formed sufficiently thin so that it is fully depleted of majority carriers therein. The intrinsic (or lightly doped) layer must also be substantially depleted of majority carriers in order to provide optimum symmetry of the I-V characteristic of the structure. An additional layer of opposite conductivity-type semiconductor material is epitaxially formed adjacent the thin critical layer and should be of sufficient thickness and impurity concentration so that it is not fully depleted of carriers during operation. This layer also provides a good barrier between an outer an outer ohmic metal contact and the thin critical epitaxial layer of the one conductivity-type. Preferably, all of the above layers are formed on a substrate layer in successive steps of controlled molecular beam epitaxy.

The above purposes, advantages, and other novel features of this invention will become better understood in the following description of the accompanying drawings wherein:

DRAWINGS

FIGS. 2A and 2B illustrate the majority carrier potential barrier extending across the various layers of the diode.

FIGS. 2C and 2D illustrate the increasing majority carrier potential across the diode structure of FIG. 2A for forward bias and reverse bias conditions, respectively.

DETAILED DESCRIPTION

Figure 1A:
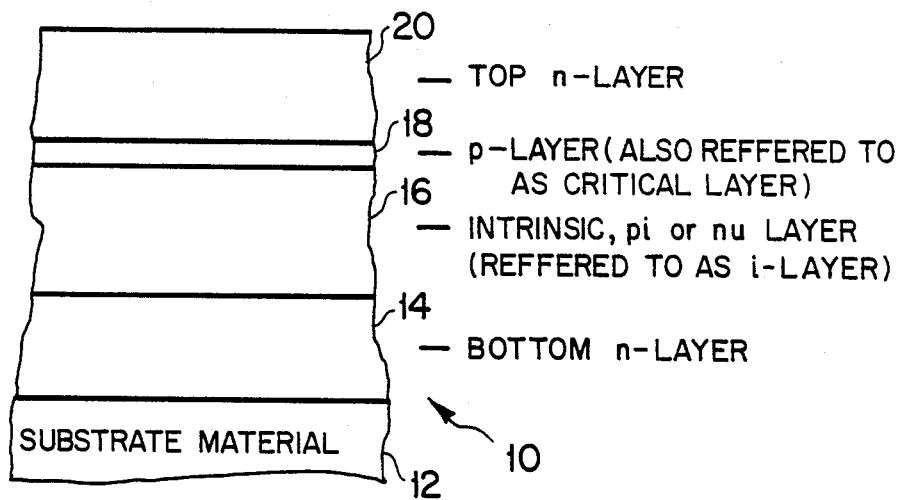
FIGS. 1A and 1B illustrate the basic structural configuration of the novel detector/mixer diode according to the invention.
Figure 1B:
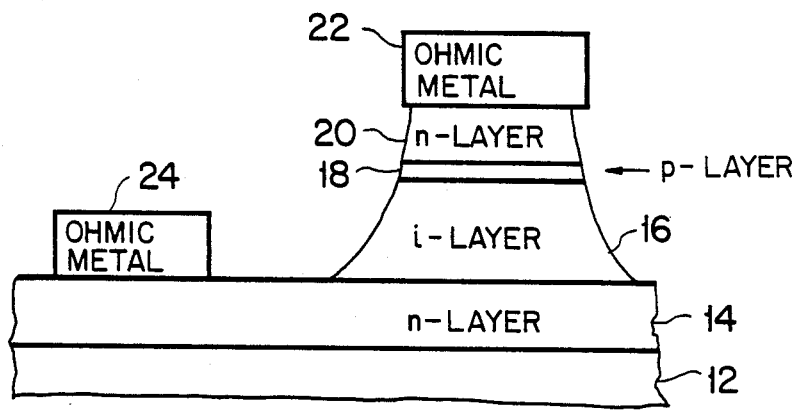

Referring now to FIGS. 1A and 1B, the diode structure is indicated generally as 10 and includes a semi-insulating gallium arsenide (GaAs) substrate 12 which is typically $10^7$ to $10^8$ ohm-centimeters in resistivity and 8 to 10 mils in thickness. An N type epitaxial layer 14 is deposited on the substrate 12 and is typically 5000 Angstroms in thickness and has a doping concentration of about $10^{18}$ silicon dopant atoms per cubic centimeter. the next layer 16 is an intrinsic or "I" layer of approximately 3000 Angstroms in thickness and typically has a doping concentration of about $10^{14}$ dopant atoms per cubic centimeter.

the intrinsic layer 16 has a thin P type layer 18 of epitaxial material deposited on its upper surface, and the P type layer 18 is also referred to herein as the critical layer. This layer 18 may range in thickness between 25 and 140 Angstroms, but will normally be about 40-50 Angstroms in thickness, and thus sufficiently thin so as to be fully depleted of majority carriers (or holes) in this structure. The dopant concentration of layer 18 will be about $8 \times 10^{18}$ beryllium atoms per cubic centimeter. A top N type layer 20 is epitaxially deposited as shown on the top surface of P type layer 18, and this upper layer 20 will typically be about 3000 Angstroms in thickness and will have a carrier concentration of about $5 \times 10^{18}$ silicon atoms per cubic centimeter.

The type of semiconductor material of the structures described herein is not critical, and such type only determines the potential barrier height range that can be achieved for these structures which are all formed preferably using molecular beam epitaxial (MBE) deposition processes. Such known and commercially available computer controlled MBE processes are preferred in that they are presently capable of providing the best repeatable layer thickness control and doping uniformity of any presently available epitaxial processes. Although the critical layer 18 may range in thickness from 25 to 140 Angstroms it is preferred that it be 40 to 50 Angstroms in thickness, with a maximum acceptable tolerance of ±5 Angstroms.

In the MBE best mode process used in constructing the devices disclosed and claimed here, both silicon and beryllium were alternated in the MBE epi system for N and P type doping respectively.

the presently known best mode for carrying out the MBE epitaxial deposition according to the invention is the use of an MBE epitaxial reactor known in the trade as the VARIAN GEN-2 available from VARIAN ASSOCIATES of Palo Alto, California, with MBE shutter control provided by a Hewlett Packard HP1000 computer. For convenience, a summary table of the various layer thickness or thickness range and doping levels is given below for the device structure of FIG. 1A. It will be understood, however, that these doping levels and thickness apply equally to corresponding layers of the devices subsequently described with reference to FIGS. 3A-3D.

TABLE

| LAYER | THICKNESS | DOPING CONCENTRATION |
|---|---|---|
| 14 | 5000 Å | $10^{18}$ silicon atoms/cc |
| 16 | 3000 Å | $10^{14}$ atoms/cc |
| 18 | 25–140 Å | $8 \times 10^{18}$ Be atoms/cc |
| 20 | 3000 Å | $5 \times 10^{18}$ silicon atoms/cc |

For a further discussion of this MBE technology, reference may be made to Proceedings of the Fifth Molecular Beam Epitaxy Workshop edited of John R. Arthur, attended Oct. 6-7, 1983, Georgia Institute of Technology, Atlanta, Ga. and published for the American Vacuum Society by the American Institute of Physics, New York 1984, incorporated herein by reference.

The semiconductor device of FIG. 1A has electrons as its majority carriers, but if N layers are changed to P layers and vice versa, the majority carriers become holes. Ohmic or non rectifying contacts 22 and 24 are made to the N type layers 20 and 14 respectively in FIG. 1A, and the diode structure is etched in a mesa-like configuration with the side wall contours shown and isolated physically on the N layer 14 from the ohmic contact 24. However, if a conducting substrate 12 is used instead of a semi-insulating substrate material, then the N layer 14 can be ommitted and the intrinsic layer 16 positioned directly atop the proposed or alternative conductive substrate material (not shown). the exact mesa type configuration of the NPI structural portion of FIG. 1B may be determined by mesa etching, ion milling or other similar known processing methods, The proper thickness and doping levels of the above described semiconductor layers of the diode structure are essential to optimum device operation. The top layer 20 needs to be thick enough so that it is not fully depleted of majority carriers during operation, and it also must be sufficiently thick to provide an adequate barrier between the ohmic contact 22 (which diffuses partially into the top N layer during alloying) and the thin critical P layer 18. If the N layer 20 doping level is sufficiently high, non alloyed contacts can be utilized and the diffusion of the metal will not be a problem. The thickness and impurity doping level of the P type layer 18 and the impurity doping level in the top N layer 20 are all determinative of the height of the potential barrier at the PN junction between layers 18 and 20. This condition is quite different from the planar doped barrier diode of the above identified Malik U.S. Pat. No. 4,410,902 where the potential barrier height is determined by the P layer doping, the P layer thickness and the thicknesses of the two (2) intrinsic layers used therein. The P layer 18 in FIGS. 1A and 1B needs to be sufficiently thin so that it is fully depleted of majority carriers, and the intrinsic or lightly doped layer 16 must be appreciably depleted of majority carriers so as to give optimum asymmetry to the I-V characteristic of the diode.

The thickness and doping level of the bottom N layer 14 is not critical as long as a good ohmic contact can be made to this layer and as long as the layer 14 is thick enough and sufficiently doped to provide a low series resistance on the order of 0.5 to 10 ohms. In fact, these devices can be made on a conductive substrate, in which case no bottom N layer 14 is needed.

Referring now to FIGS. 2A through 2D, the diagrams shown in these figures illustrate the operation of the diode structure according to the invention. The shaded portion of FIG. 2A indicates the depleted regions of the various epitaxial layers at zero bias, and the diagram of FIG. 2B illustrates the varying majority carrier potential gradient horizontally across the structure of the device. Since the intrinsic layer 16 is relatively large in thickness and high in resistance compared to any other region of the device structure, most of the potential drop occurs across this region 16. Under forward bias, the depleted region of the top N layer 20 grows at the expense of the depleted region of the bottom N layer 14 thereby causing the bottom N layer 14 to increase its potential relative to that of the top N layer. This characteristic allows electrons to flow from region 14 to region 20.

FIG. 2C illustrates the increasing majority carrier potential across the diode structure under forward bias conditions, whereas FIG. 2D illustrates the increasing majority carrier potential across the diode structure under reverse bias conditions. The difference between forward and reverse bias is that it takes more voltage to achieve the same current level in reverse bias because most of the voltage is dropped across the intrinsic layer 16. Only a small fraction of the applied voltage is available to change the potential of layer 20, whereas most of the voltage is available to change the potential of layer 14.

Referring now to FIGS. 3A through 3D, there are shown respectively four (4) structural modifications of the diode structure in FIG. 1B, and all of these diode structural modifications in FIGS. 3A through 3D are alternative embodiments of the invention. All of these alternative embodiments serve to establish the potential barrier $\Phi_B$ in volts The value of $-\Phi_B$ (where q is the charge on an electron) is somewhere between zero electron volts and the semiconductor bandgap energy.

Figure 3B:
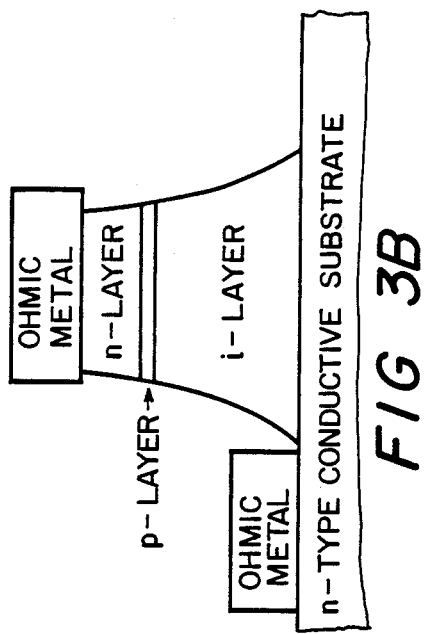
FIGS. 3A through 3D illustrate respectively four (4) alternative structural embodiments of the invention wherein either the exact position or the conductivity type of the thin critical layer are different in each structure, but are operative to functionally accomplish the same detection or mixing function to be further described.
Figure 3D:
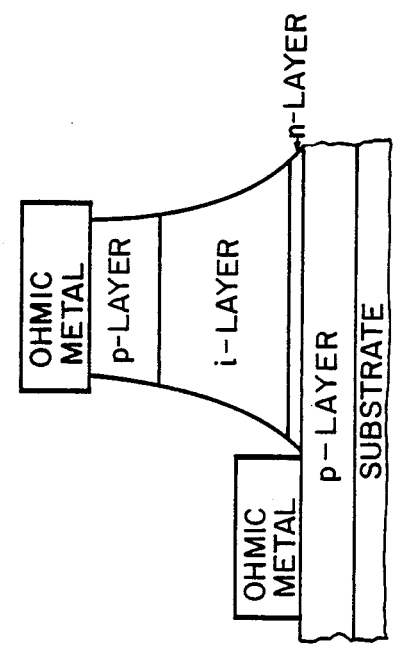
Figure 3A:
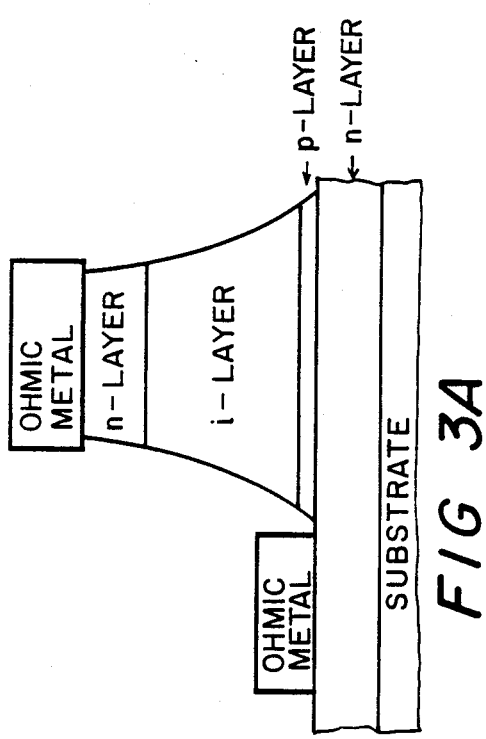

In FIG. 3A the critical P layer has been moved from the top side of the intrinsic layer (FIG. 1B) to the bottom surface thereof where it separates the intrinsic layer and the bottom N type layer of the device.

In FIG. 3B, the diode structure has been modified to eliminate the bottom N type layer and dispose the intrinsic layer directly on the N type conductive substrate as shown.

Figure 3C:
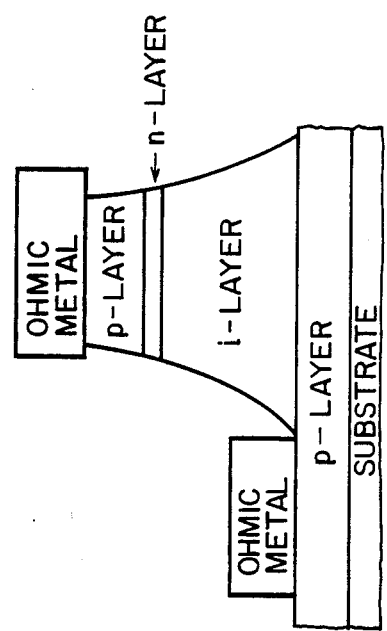

In FIG. 3C, the conductivity types and vertical geometry of the various layers of FIG. 3A have been reversed, so that the critical layer is now an N type layer positioned between a top P type layer and the intrinsic layer as shown.

Finally, in FIG. 3D the conductivity types of the layers of FIG. 3A have been reversed in polarity as indicated.

The quantity $\Phi_B$ is the zero bias barrier height in volts. An externally applied forward bias voltage of this order or higher will essentially turn on these devices to a fully conductive state. This state corresponds to approximately zero video resistance, where the video resistance is defined by the slope of the current-voltage curve taken at the applied bias voltage. In FIG. 2A and 2B, this barrier height when multiplied by $-q$ is an energy somewhere between zero electron volts and the semiconductor bandgap energy and will typically be about 0.25 electron volt. For this structure, it can be shown that:

$$\Phi_B = \frac{q}{2e_S} \cdot \left[ N_A + \frac{N_A^2}{N_D} \right] \cdot t^2$$

where $e_s$ is the dielectric constant of the semiconductor material, $N_A$ is the doping concentration of the P+ critical layer 18, $N_D$ is the doping concentration of the N+ layer 20, and t is the thickness of the critical layer 18.

DIODE DETECTION

Figure 4A:
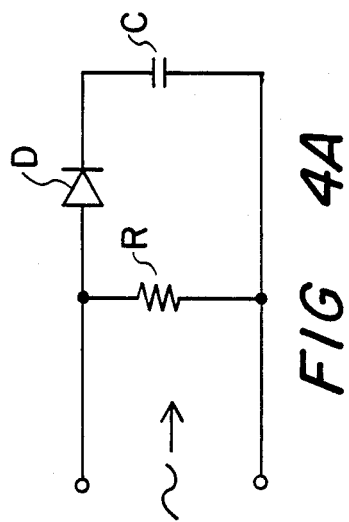
FIGS. 4A and 4B show a diode detection network (and associated I-V characteristic) utilizing the diode according to the invention.
Figure 4B:
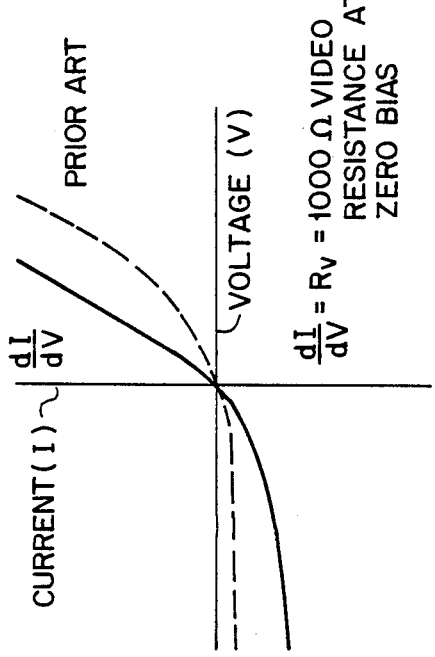

Referring now to FIGS. 4A and 4B, there is shown a conventional diode detector network including an input impedance matching resistor R typically of about 50 ohms, a diode D and an output capacitor C for developing a detection voltage envelope thereacross in accordance with well known detection principles. As is also well known, the detection efficiency of the diode D is directly proportional to the degree of asymmetry of its I-V characteristic as indicated in FIG. 4b. Thus typical detector diodes of the prior art will have a I-V characteristic as indicated by the curved dotted line in FIG. 4B and will have a very large video resistance, Rv, at zero basis on the order of about 600,000 ohms. Since it is generally accepted that this video resistance, Rv, must be on the order of 1000 ohms for maximum detection sensitivity, then these detector diodes of the prior art are typically DC biased to about 0.7 volts in order to reduce the video resistance to 1000 ohms.

However, as indicated by the solid dI/dV curve which is the I-V characteristic of the present invention, the video resistance at zero volts DC bias is about 1000 ohms, and thus no separate applied DC bias is required. It is to be understood however that these comparisons to the prior art diodes are based upon the same very small diode area of about 20 square microns of anode surface area necessary to keep junction capacitance at a minimum value on the order of $10^{-14}$ farads.

DIODE MIXING

Figure 5A:
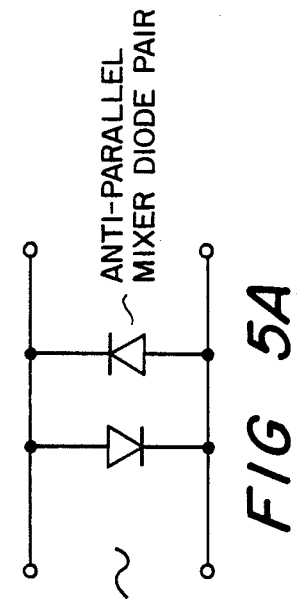
FIGS. 5A and 5B show an anti-parallel diode mixer pair (and associated I-V characteristic) for the mixer diode according to the invention.
Figure 5B:
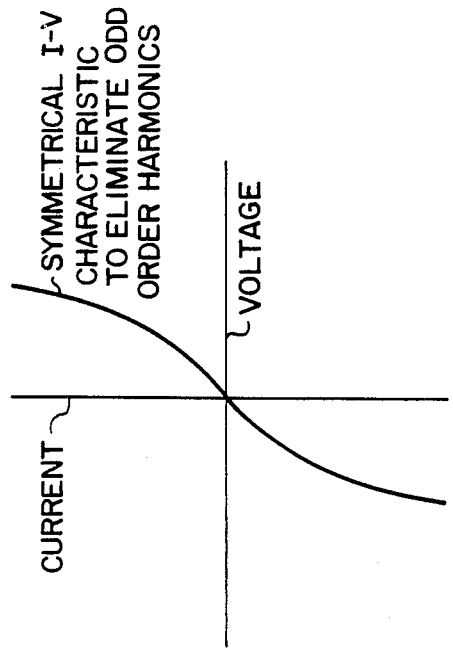

When the diode structure according to the invention is to be used in a mixer circuit, two (2) of these identical devices are connected in parallel and in reverse polarity as shown in Figure 5A in the well known "anti-parallel" mixing mode of operation. The connection of reverse poled diodes in such an anti-parallel diode network is well known in the art, and the advantage presented by the present invention is that two substantially identical mixer diodes fabricated side by side on a common semiconductor wafer will have substantially identical I-V characteristics. Thus, the net overall I-V characteristics of these two identical diodes connected in parallel is a completely symmetrical curve as shown in FIG. 5B whose first quadrant contour is an identical match to its third quadrant contour, resulting in the complete elimination of mixing with odd order harmonics of the fundamental mixing frequency. This feature has the effect of lowering device noise inasmuch as it enables one to detect very small input signals on a spectrum analyzer. Additionally, since the number of mixing products is decreased, it now becomes easier to identify the desired mixing product. This complete symmetry of I-V characteristics of the anti-parallel diode mixer pair according to this invention is not achievable by way of the above identified Malik structure by reason of the extraneous and unwanted impurity doping previously described.

Thus, there has been demonstrated a new and improved semiconductor device, which when used as a broadband non-biased detector, has a 5db greater dynamic range and improved flatness than any known similar device on the market. The range of operation of this device has been demonstrated from DC to 110 GHz; however higher operational frequencies are expected.

When this device is used in the anti-parallel mixer configuration at millimeter wave frequencies as a high harmonic (greater than the 10th harmonic) mixer, no DC bias is needed to obtain state of the art conversion efficiencies across an entire waveguide band. This fact has been demonstrated through W band (110 GHz). Other mixers on the market today require a variable DC bias to obtain efficient mixing across these millimeter wave bands.

The present invention is not limited to the use of GaAs, and alternatively may be carried out using gallium phosphide (GaP), indium gallium arsenide (InGaAs) or other equivalent semiconductor materials or even silicon epitaxy in cases where the slower speeds of silicon are acceptable for certain application.

Finally, the present invention is not limited to the use of MBE epitaxial processes and alternatively may employ other epitaxial processes which are capable of repeatably controlled epi growth of plus or minus (+) 25 Angstroms with uniform doping concentration. Such control and uniformity may be achievable using certain state of the art organo-metallic vapor phase epitaxial (OMVPE) processing techniques known and available to those skilled in the art.

I claim:

1. A diode structure operative at zero volts DC bias to provide both efficient detection in diode detector applications and to provide effective harmonic suppression in anti-parallel mixer diode applications, comprising:
   a. a single substantially intrinsic semiconductor layer of a predetermined thickness and impurity concentration and substantially depleted of a majority carriers,
   b. a critical thin layer of one conductivity type disposed on one surface of said intrinsic layer and being sufficiently thin and of an impurity concentration level sufficient so that it is fully depleted of majority carriers at zero volts DC bias, said intrinsic layer being disposed on only one surface of said critical thin layer,
   c. a layer of opposite conductivity type semiconductor material disposed on the surface of said critical thin layer and of a thickness sufficient to shield metal impurities from said critical thin layer,
   d. a first ohmic contact on said layer of opposite conductivity type semiconductor material, and
   e. a second ohmic contact in electrical contact with said intrinsic layer, whereby the potential barrier height of said structure, $\Phi_B$, when multiplied by the charge on an electron, $-q$, is established at a minimum value somewhere between zero electron volts and the bandgap energy of the semiconductor material of said layers.

2. The structure defined in claim 1 wherein said critical thin layer may range between 25 and 140 Angstroms in thickness.

3. The structure defined in claim 2 wherein said intrinsic layer is between 500 and 15,000 Angstroms in thickness.

4. The structure defined in claim 3 wherein said opposite conductivity type layer is on the order of 3,000 Angstroms in thickness.

5. The structure defined in claim 4 wherein the doping level in said intrinsic layer is on the order of $10^{14}$ atoms/cc, the doping level in said critical thin layer is on the order of $8 \times 10^{18}$ atoms/cc and the doping level in said opposite conductivity type layer is on the order of $5 \times 10^{18}$ atoms/cc.

6. A method for detecting microwave or millimeter wave signals which includes connecting the detector structure according to claim 1 in a detection circuit having an output network for developing a voltage envelope proportional to an input signal, and requiring no DC bias for said detector structure.

7. A method for mixing microwave or millimeter wave signals which includes connecting two (2) diodes of the type defined in claim 1 in a reverse poled anti-parallel circuit configuration, whereby said diodes provide a composite highly symmetrical I-V characteristic sufficient for suppressing or substantially eliminating odd harmonic frequencies of the fundamental frequency of the incoming signal applied to said anti-parallel pair.

8. A semiconductor device structure of the group consisting of a successively ordered N type semiconductor layer, an interior P type semiconductor layer, a single intrinsic (I) type semiconductor layer, and another N type semiconductor layer in a layered configuration and (b) a successively ordered P type semiconductor layer, an interior N type semiconductor layer, a single intrinsic (I) type semiconductor layer, and another P type semiconductor layer in a layered configuration, and having a minimum potential barrier height when multiplied by the charge on an electron, $-q$, is a value between zero electron volts and the semiconductor bandgap energy, characterized in that each intrinsic layer is substantially depleted of majority carriers, said intrinsic layer being disposed on only one surface of each interior semiconductor layer, and each interior semiconductor layer adjacent each intrinsic layer is between 25 and 140 Angstroms in thickness and also depleted of majority carriers at zero volts DC bias.

9. The structure defined in claim 8 wherein each intrinsic layer is between 500 and 15,000 Angstroms in thickness.

10. The structure defined in claim 9 wherein each intrinsic layer has an impurity concentration on the order of about $10^{14}$ atoms/cc and each interior semiconductor layer has an impurity concentration on the order of $10^{18}$–$10^{19}$ atoms/cc.

11. The structure defined in claim 10 wherein said layers consist of a material selected from among the group comprising gallium arsenide, gallium phosphide, and indium gallium arsenide.

* * * * *